United States Patent [19]
Benjamin et al.

[11] Patent Number: 5,562,496
[45] Date of Patent: Oct. 8, 1996

[54] SURFACE MOUNT ELECTRICAL CONNECTOR WITH IMPROVED GROUNDING ELEMENT

[75] Inventors: Karen E. Benjamin; John J. Consoli, both of Harrisburg, Pa.

[73] Assignee: The Whitaker Corporation, Wilmington, Del.

[21] Appl. No.: 537,195

[22] Filed: Sep. 29, 1995

Related U.S. Application Data

[63] Continuation of Ser. No. 330,177, Oct. 27, 1994, abandoned, which is a continuation-in-part of Ser. No. 250,419, May 26, 1994, abandoned.

[51] Int. Cl.⁶ .............................................. H07R 13/648
[52] U.S. Cl. ............................................ 439/607; 439/108
[58] Field of Search ..................................... 439/108, 571, 439/607, 608

[56] References Cited

U.S. PATENT DOCUMENTS

| | | | |
|---|---|---|---|
| 4,512,618 | 4/1985 | Kumar | 439/607 |
| 4,679,883 | 7/1987 | Assini et al. | 439/607 |
| 4,721,473 | 1/1988 | DelGuidice et al. | 439/79 |
| 4,842,528 | 6/1989 | Frantz | 439/80 |
| 4,898,546 | 2/1990 | Elco et al. | 439/608 |
| 4,908,335 | 3/1990 | Cosmo et al. | 439/79 |
| 4,943,244 | 7/1990 | Teck et al. | 439/567 |
| 4,968,261 | 11/1990 | Mizunuma | 439/108 |
| 5,004,430 | 4/1991 | DelGuidice et al. | 439/350 |
| 5,083,926 | 1/1992 | Kissinger et al. | 439/78 |
| 5,228,873 | 7/1993 | Hirai | 439/607 |
| 5,249,983 | 10/1993 | Hirai | 439/573 |
| 5,256,085 | 10/1993 | Tan et al. | 439/607 |
| 5,334,049 | 8/1994 | Kachlic et al. | 439/567 |

FOREIGN PATENT DOCUMENTS

| | | |
|---|---|---|
| 0333386A1 | 10/1989 | European Pat. Off. . |
| 0560188A1 | 3/1993 | European Pat. Off. . |

*Primary Examiner*—Gary F. Paumen

[57] ABSTRACT

An electrical connector (10) for surface mounting to a printed circuit card (12) includes an insulating housing (20,116), contacts (24) secured in the housing, a metal shell (30,120) for inductively shielding the contacts and an improved grounding element (32,34,100) which extends into a cavity (66,118) provided therefor in the housing. The grounding element, the housing and the metal shell are arranged so that when the grounding element is inserted into the cavity, a contact region (42,106) of the grounding element engages the metal shell. The grounding element also includes a solder flange portion (36,102) which extends laterally outwardly from the housing for soldering to a ground pad (18) on the printed circuit card.

26 Claims, 7 Drawing Sheets

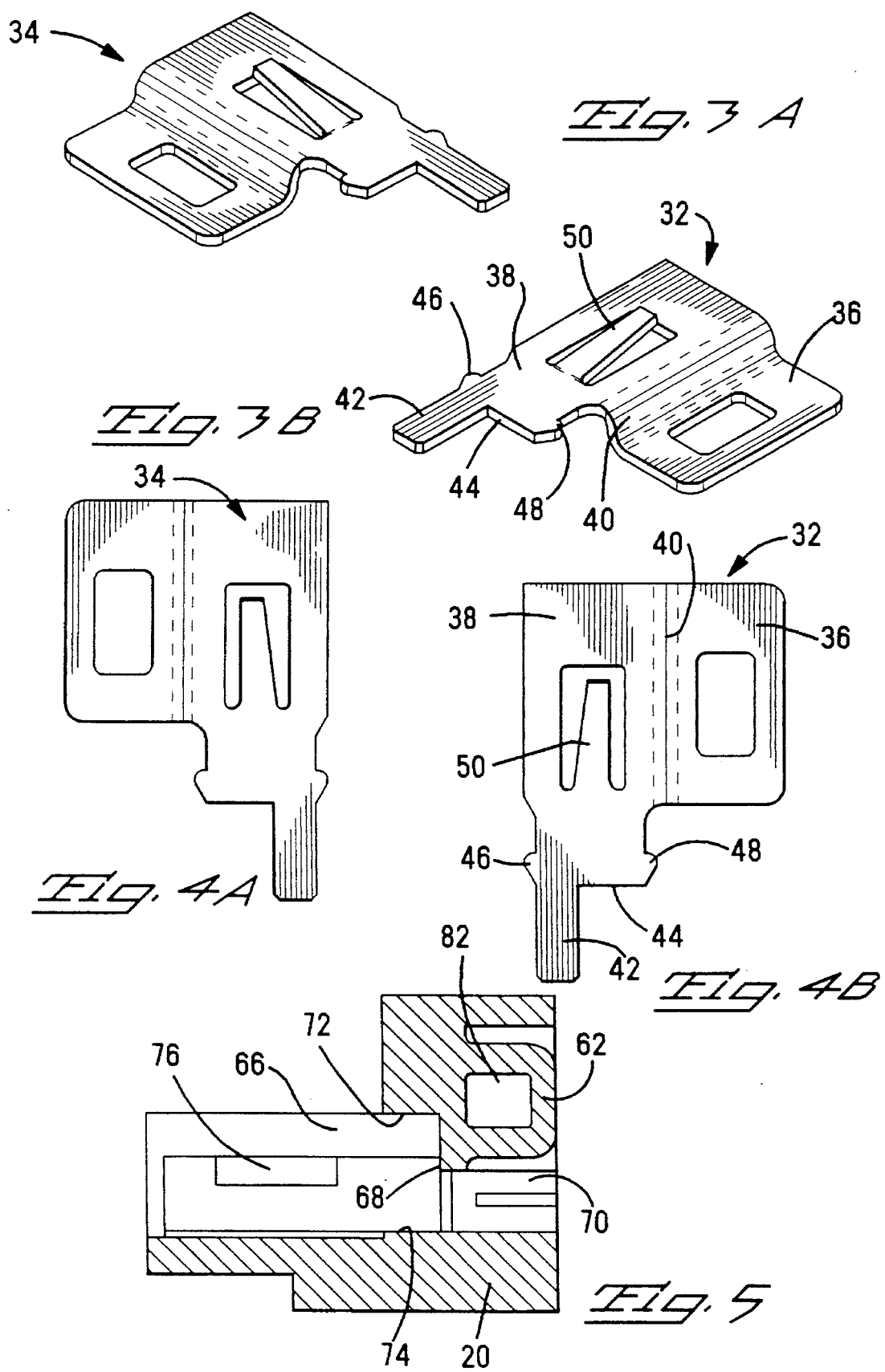

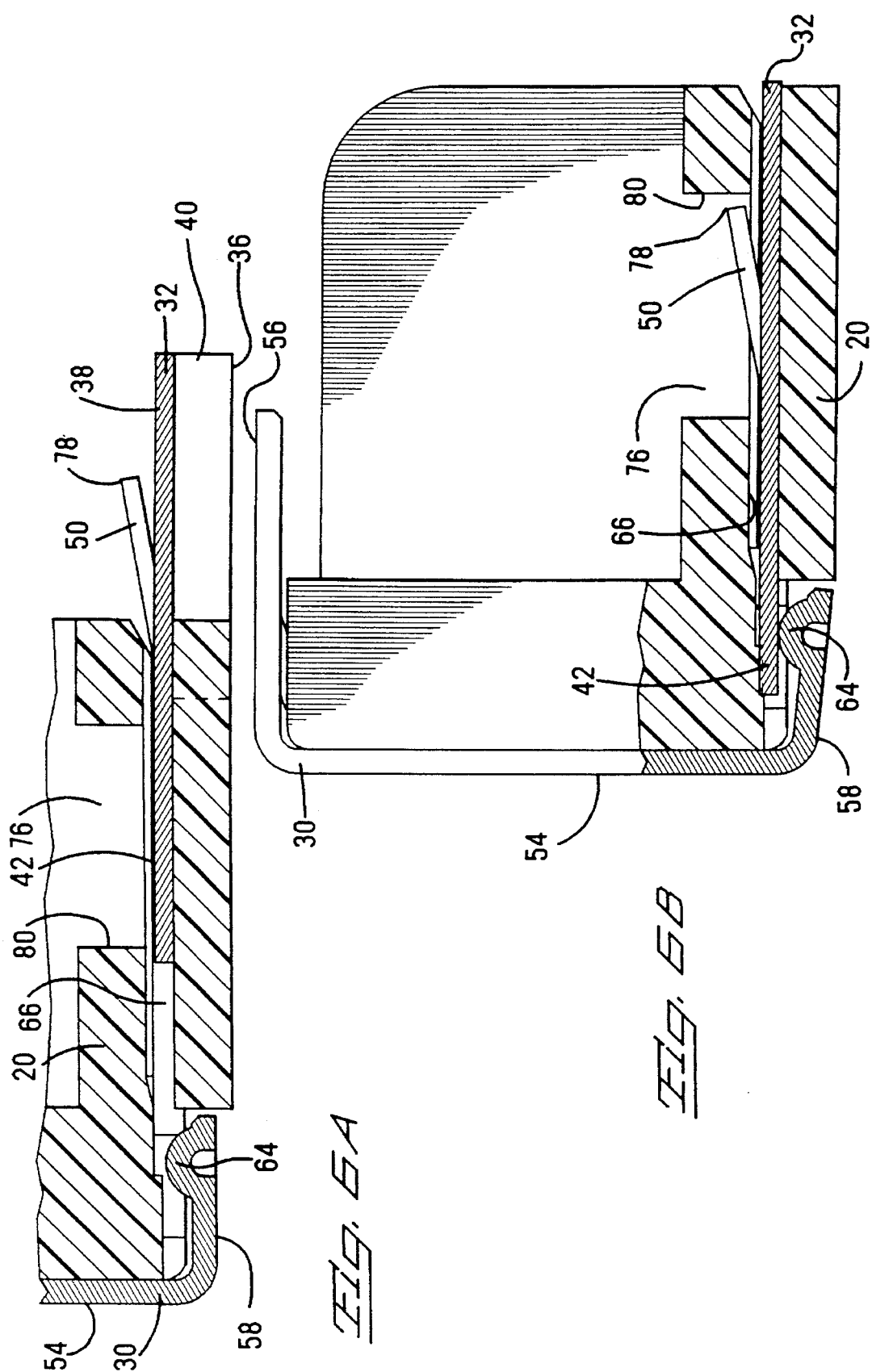

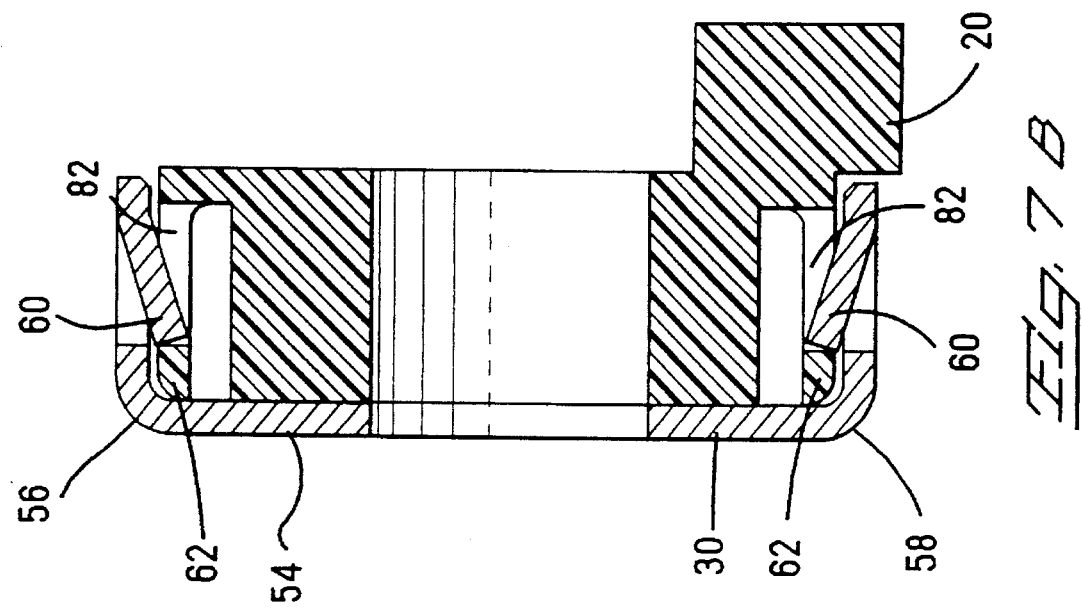
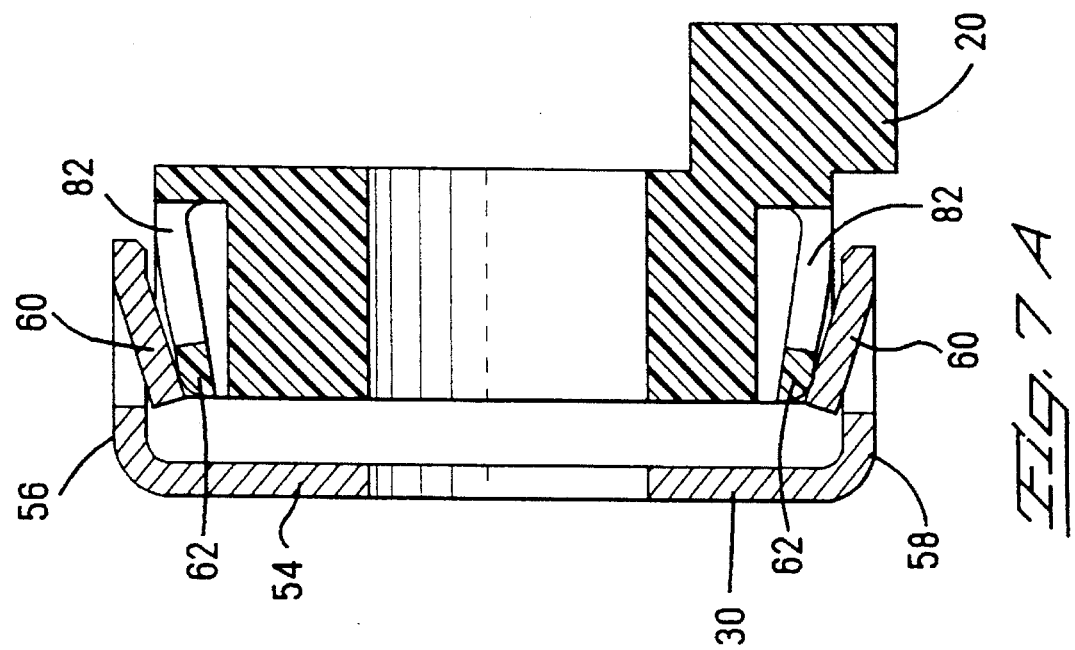

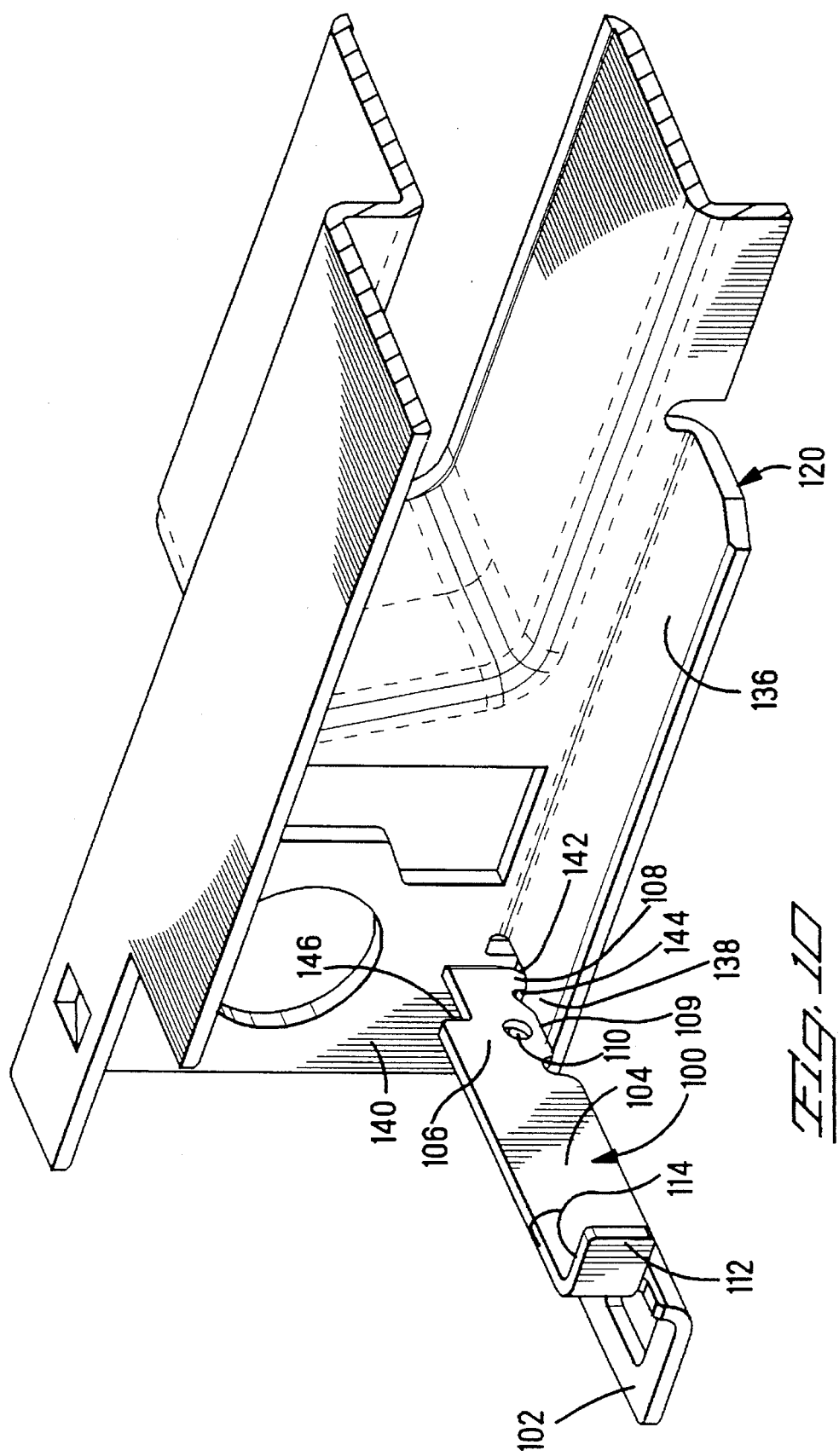

SURFACE MOUNT ELECTRICAL CONNECTOR WITH IMPROVED GROUNDING ELEMENT

This is a continuation of Ser. No. 08/330,177 filed Oct. 27, 1994, now abandoned, which is a continuation-in-part of Ser. No. 08/250,419 filed May 26, 1994, now abandoned.

BACKGROUND OF THE INVENTION

This invention relates to an electrical connector adapted for surface mounting to a printed circuit card and, more particularly, to an improved grounding element for such a connector which is easily installed and retained without requiring a separate fastener.

In order to connect circuitry on a printed circuit card within an enclosure with external circuitry, it is common practice to provide an electrical connector which is surface mounted to the printed circuit card. Such a connector conventionally includes a plurality of contacts secured within an insulating housing. The contacts are typically soldered to signal traces on the printed circuit card and are adapted for frictional engagement with respective contacts of a mating connector. It is also common practice to provide as part of such a connector a metal shell which is mounted to the housing and at least partially surrounds the plurality of contacts so as to function as an inductive shield for the contacts. To effect the shielding function, the metal shell must have electrical continuity to a ground trace on the printed circuit card, typically via a grounding element which is part of the connector. It is an object of the present invention to provide an electrical connector of the type described with an improved grounding element which is easily assembled to the connector without requiring a separate fastener and which assists in stably mounting the connector to the printed circuit card through its solder connection to the ground trace.

SUMMARY OF THE INVENTION

The present invention finds utility in an electrical connector adapted for surface mounting to a printed circuit card having a plurality of signal traces and at least one ground trace. The connector comprises an insulating housing having a forward mating end and a rear end as well as a plurality of contacts secured in the insulating housing. The contacts are exposed at the rear end of the housing for connection to respective signal traces and are exposed at the forward mating end of the housing for frictional engagement with respective contacts of a mating connector. The connector further includes a metal shell mounted to and at least partially surrounding the housing for shielding the contacts and a grounding element for connection to the metal shell and to a ground trace on the printed circuit card. In accordance with the present invention, the grounding element includes a generally planar solder flange portion adapted for a solder connection to the ground trace and a connecting portion with a forwardly extending contact region adapted for electrical contact with the metal shell. The housing is formed with a cavity for receiving the grounding element connecting portion from the rear end of the housing with the contact region extending forwardly out of the cavity so as to be exposed to the metal shell. The metal shell is adapted for mounting to the housing from the forward mating end and is formed with means for engaging the exposed contact region of the grounding element connecting portion.

In accordance with an aspect of this invention, the housing is formed with a latch chamber intersecting the cavity and the grounding element connecting portion is formed with a resilient latch finger extending rearwardly away from the grounding element connecting portion. The latch finger is adapted to enter the latch chamber when the grounding element connecting portion is fully inserted in the cavity so as to retain the grounding element connecting portion in the cavity.

In accordance with a further aspect of this invention, the grounding element connecting portion is generally planar and is substantially parallel to and offset from the grounding element solder pad portion, and the cavity of the housing is generally planar.

In accordance with another aspect of this invention, the means for engaging the exposed contact region comprises a projection of the metal shell extending toward the exposed contact region. Preferably, the projection is substantially in the form of a hemisphere. In accordance with yet another aspect of this invention, the housing is formed with a support ledge external to the cavity and adjacent the forward end of the cavity for supporting the contact region of the grounding element connecting portion in an exposed manner.

In accordance with yet a further aspect of this invention, the metal shell includes a laterally extending tab which is generally parallel to the grounding element solder flange portion and the grounding element connecting portion is generally orthogonal to the solder flange portion. The grounding element contact region is formed with a hook at its forward end which is adapted to engage the metal shell tab when the grounding element connecting portion is fully inserted in the cavity so as to retain the grounding element connecting portion in the cavity.

In accordance with still another aspect of this invention, the metal shell tab includes an end portion which is bent so as to be generally parallel and adjacent to the grounding element contact region, and the grounding element contact region includes a projection extending toward and contacting the tab end portion. Preferably, the grounding element contact region projection is substantially in the form of a hemisphere. In accordance with still a further aspect of this invention, at least a defined edge portion of the grounding element connecting portion is remote from and parallel to the plane of the grounding element solder flange portion. The insulating housing has a generally planar mounting surface for engagement with the printed circuit card and the insulating housing cavity has a generally planar defined roof portion which is parallel to the plane of the mounting surface. The defined roof portion is so located that when the grounding element is fully inserted in the cavity the defined edge portion is immediately adjacent the defined roof portion. The insulating housing and the shell together provide means for biasing the grounding element to engage the defined edge portion against the defined roof portion. Accordingly, the solder flange portion of the grounding element is maintained in co-planar relationship with the mounting surface of the insulating housing.

BRIEF DESCRIPTION OF THE DRAWINGS

The foregoing will be more readily apparent upon reading the following description in conjunction with the drawings in which like elements in different figures thereof are identified by the same reference numeral and wherein:

FIGS. 3A and 3B are perspective views of the left and right grounding elements, respectively, of the first embodiment of the electrical connector according to this invention;

FIGS. 4A and 4B are top plan views of the left and right grounding elements, respectively, shown in FIGS. 3A and 3B;

FIG. 5 a cross sectional view of a portion of the housing of the connector taken along the line 5—5 in FIG. 1 in the plane of the cavity;

FIGS. 6A and 6B are partial cross sectional views taken along the line 6—6 in FIG. 1 showing two stages of the insertion of the grounding element into the cavity of the housing;

FIGS. 7A and 7B are cross sectional views taken along the line 7—7 in FIG. 1 showing two stages in the mounting of the metal shell to the connector housing;

FIG. 10 is a rear perspective view of the elements shown in FIG. 9 taken from the other side relative to FIG. 9.

DETAILED DESCRIPTION

Figure 1:
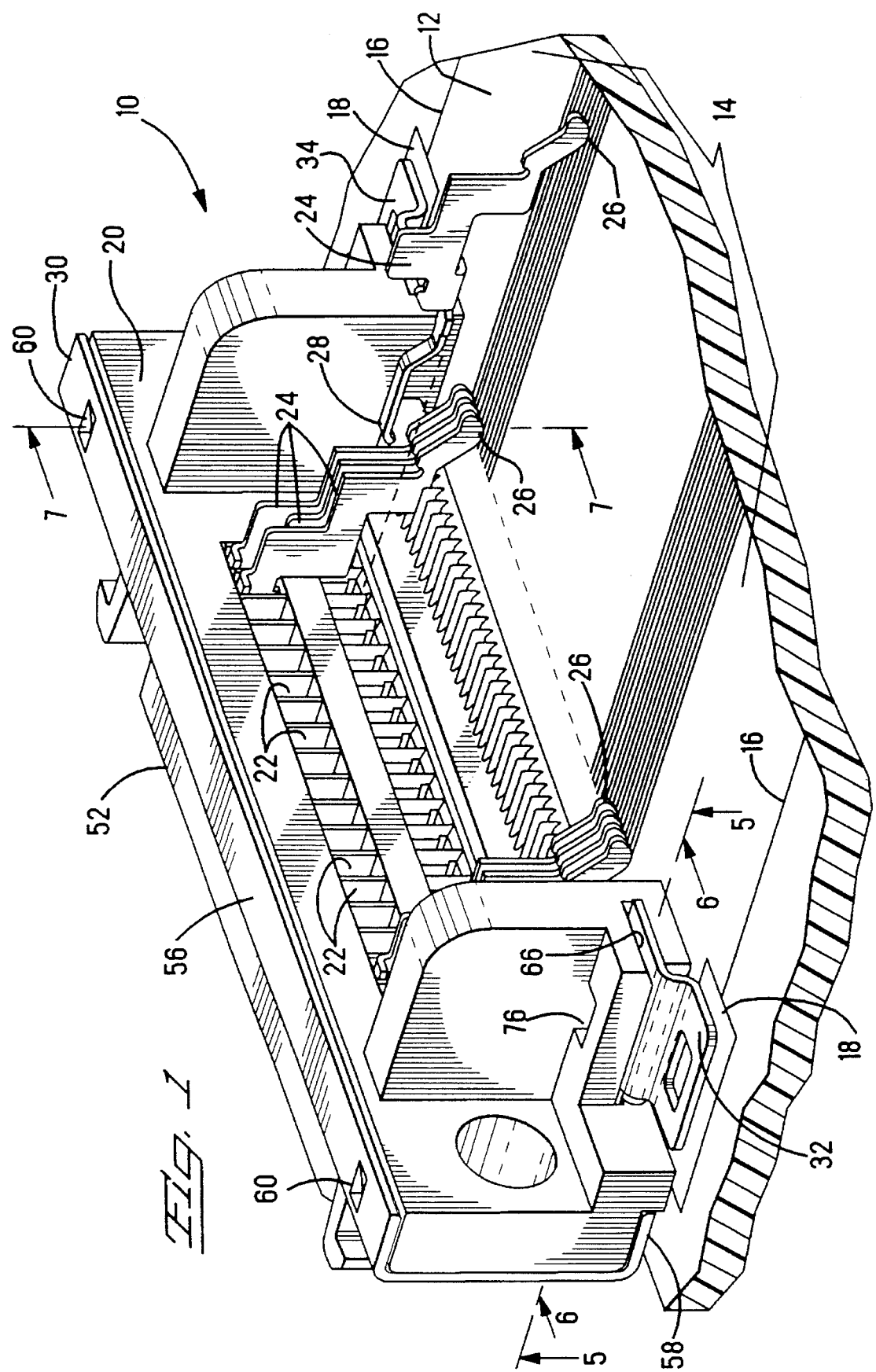
FIG. 1 is a rear perspective view of a first embodiment of an electrical connector according to the present invention mounted to a printed circuit card.

Referring now to the drawings, FIG. 1 illustrates a first embodiment of an electrical connector, designated generally by the reference numeral 10, which is surface mounted to a printed circuit card 12. The printed circuit card 12 has thereon a plurality of signal traces 14 and ground traces 16. The signal traces 14 terminate in a single row for solder connection to contacts of the connector 10, as will be described hereinafter. The ground traces 16 terminate in enlarged ground pads 18 for solder connection to the grounding elements of the connector 10, as will be described hereinafter.

The connector 10 includes an insulating housing 20 having a plurality of channels 22 for securing therein a respective plurality of contacts 24. The contacts 24 are exposed at the rear end of the housing 20, as shown in FIG. 1, and are each provided with a tail 26 adapted to be soldered to respective signal traces 14 at or near their termination. The opposite end 28 of each of the contacts 24 is exposed at the forward mating end of the housing 20 for frictional engagement with a respective contact of a mating connector, as is conventional.

The connector 10 also includes a metal shell 30 which is mounted to the forward end of the housing 20 and at least partially surrounds the housing 20 so as to provide an inductive shield for the contacts 24. As will be described in full detail hereinafter, the connector 10 also includes a pair of grounding elements 32 and 34 at each of the two lateral ends of the connector 10 for providing an electrical connection between the metal shell 30 and the ground traces 16 by being soldered to the ground pads 18 on the printed circuit card 12.

The grounding elements 32 and 34 are mirror images of each other, as is clear from FIGS. 3A and 3B and FIGS. 4A and 4B. The grounding element 32 will be described in full detail, it being understood that this description also applies to the grounding element 34. Thus, the grounding element 32 includes a generally planar solder flange portion 36 and a generally planar connecting portion 38. The connecting portion 38 is substantially parallel to and offset from the solder flange portion 36, these portions being joined by a bridging portion 40. Preferably, the grounding element 32 is formed from sheet stock material which is stamped and bent in a conventional manner. The forward end of the connecting portion 38 is formed with a forwardly extending contact region 42. The contact region 42 is generally rectangular and elongated with a lateral dimension less than the lateral dimension of the remainder of the connecting portion 38. The connecting portion 38 has a shoulder 44 immediately to the rear of the contact region 42. Immediately rearward of the shoulder 44 are a pair of bulges 46 and 48 which are each shaped as a barb which flares laterally outwardly so as to be narrower toward its forward end. The connecting portion 38 is also formed, substantially centrally thereof, with a resilient latch finger 50 which extends rearwardly out of the plane of the connecting portion 38. The metal shell 30 is mounted to the insulating housing 20 from its forward end and includes a nose portion 52 which surrounds the mating ends 28 of the contacts 24. Rearwardly of the nose portion 52, the shell 30 includes a face plate 54 and two rearwardly extending flanges 56 and 58. Toward the lateral ends of each of the flanges 56 and 58 there is formed a projection 60 extending at an angle out of the plane of the respective flange 56, 58 and toward the other flange 58, 56. These projections 60 cooperate with resilient latch members 62 on the housing 20, as will be described hereinafter, to retain the shell 30 on the housing 20 after assembly of the connector 10. Adjacent the projections 60 on the flange 58 are contact projections 64 for engagement with the contact regions 42 of the grounding elements 32 and 34. The contact projections 64 extend out of the plane of the flange 58 toward the flange 56 and are preferably each in the form of a hemisphere.

Figure 2:
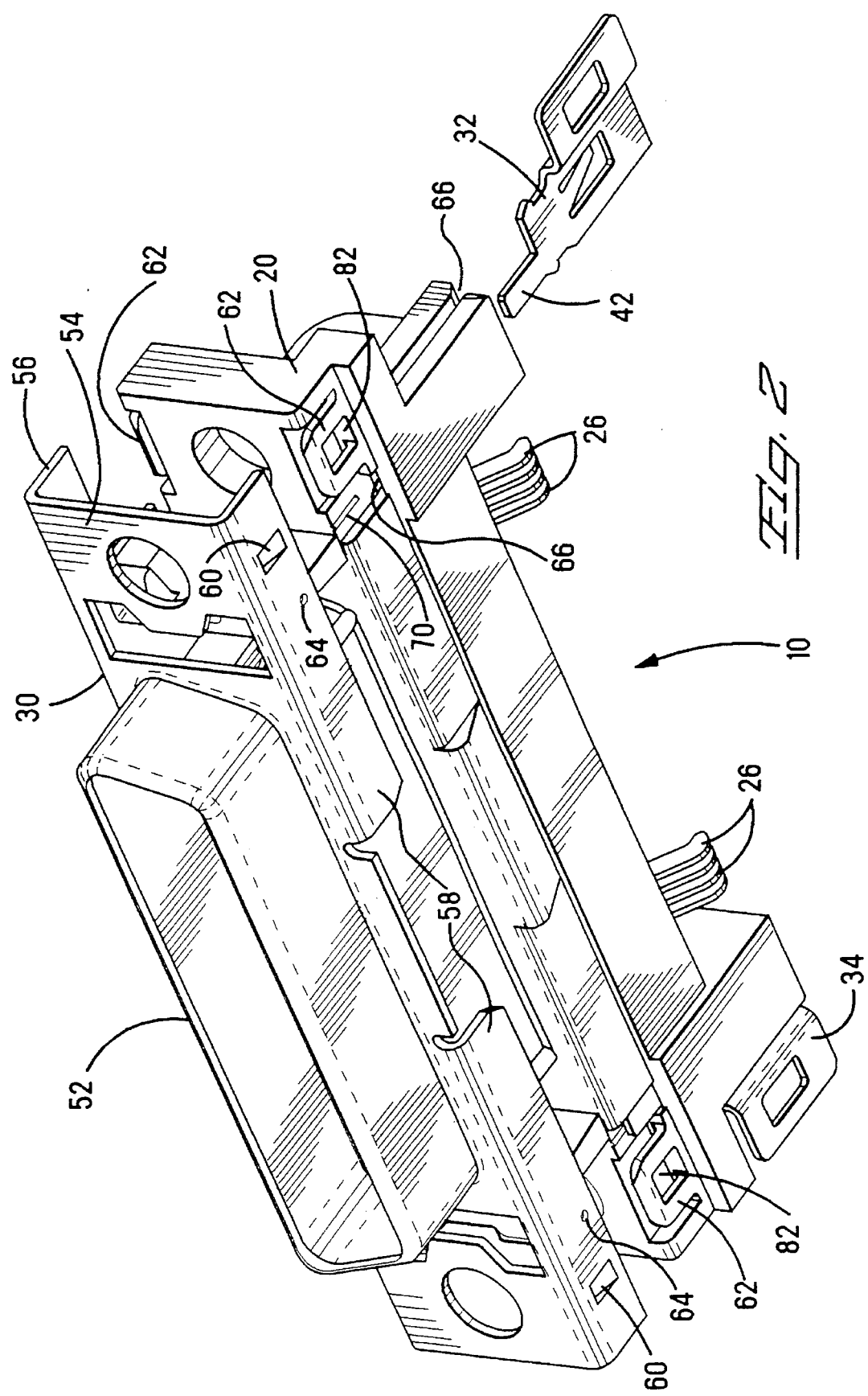
FIG. 2 is a partially exploded front and bottom perspective view of the electrical connector shown in FIG. 1.

At each lateral end of the housing 20 there is formed a specially shaped and dimensioned cavity 66 for receiving and retaining a respective one of the grounding elements 32, 34 therein. As seen in FIGS. 1 and 5, the cavity 66 is open to the rear and the side of the housing 20. FIG. 2 illustrates that the cavity 66 is also open to the forward end of the housing 20. The opening of each cavity 66 at the forward end is relatively narrow to allow the respective contact region 42 of the grounding elements 32, 34 to extend therethrough, but is flanked by a forward wall 68 with which the shoulder 44 of the grounding element 32, 34 interferes so as to limit the forward travel of the grounding element during insertion. Immediately forward of the narrow forward opening of the cavity 66, the housing 20 is formed with a support ledge 70 which supports the contact region 42 in an exposed manner. The distance between the lateral walls 72 and 74 of the cavity 66 is slightly less than the distance between the most distal parts of the bulges 46 and 48 so that when the grounding element 32, 34 is inserted into the cavity 66, there is a slight deformation of the walls 72 and 74 to provide a tight interference fit. Further, the barb-like configuration of the bulges 46 and 48 allows insertion of the grounding element 32, 34 in a forward direction but interferes with removal of the grounding element 32, 34 from the cavity 66 in a rearward direction. The cavity 66 is substantially planar to accept the planar configuration of the connecting portion 38 of the grounding element 32, 34 and has a height sufficient to provide slight clearance for the thickness of the grounding element 32, 34. The bulges 46 and 48 also provide the grounding element 32, 34 with stability not achieved by latch finger 50 alone to maintain the coplanarity of the bottom surfaces of the solder flange portion 36 and the housing 20.

The housing 20 is further formed with a latch chamber 76 which intersects the cavity 66. The latch chamber 76 is open toward the top of the housing 20, as best seen in FIG. 1. As shown in FIGS. 6A and 6B, as the grounding element 32 is inserted into the cavity 66 from the rear of the housing 20, the resilient latch finger 50 is forced toward the plane of the connecting portion 38 until such time as its trailing end 78 passes the rear wall 80 of the latch chamber 76. At that time, the latch finger 50 snaps into the latch chamber 76 so as to retain the grounding element 32 within the cavity 66. During the forward motion of the grounding element 32, assuming that the metal shell 30 had already been secured to the housing 20, the contact region 42 frictionally engages the contact projection 64, the rounded shape of which allows the contact region 42 to pass thereby while deflecting the flange 58. The resilience of the flange 58 provides for frictional engagement and electrical continuity of the contact projection 64 with the contact region 42. The metal shell 30 and the grounding element 32 can be assembled in either order.

Referring to FIGS. 7A and 7B, as the metal shell 30 is installed on the housing 20 from the front thereof, the tapered projections 60 deflect the latch members 62 inwardly. Each of the latch members 62 is generally U-shaped so that it has a central open region 82. Further movement of the metal shell 30 causes the projections 60 to enter the open regions 82 and allows the latch members 62 to return to their undeflected positions, thereby retaining the metal shell 30 on the housing 20. By placing the resilient latch members 62 on the insulating housing 20, the deflection of the metal shell 30 is limited so as to insure the integrity of the electrical contact between the metal shell 30 and the grounding element 32, 34.

After the connector 10 is assembled as aforedescribed, the connector 10 is placed on the printed circuit card 12, as shown in FIG. 1. The tails 26 of the contacts 24 are then soldered to the respective signal traces 14 and the solder flange portions 36 of the grounding elements 32, 34 are soldered to respective ground pads 18. Since the grounding elements 32, 34 are securely fastened to the housing 20 by the interference fit of the bulges 46 and 48 and by the latch finger 50, and since the contacts 24 are secured in the channels 22, soldering of the contacts 24 and the grounding elements 32, 34 is sufficient to stably secure the connector 10 to the printed circuit card 12. Further, a firm electrical connection is established between the ground pads 18 and the metal shell 30. All of the foregoing is accomplished without the necessity for a separate fastener.

Figure 8:
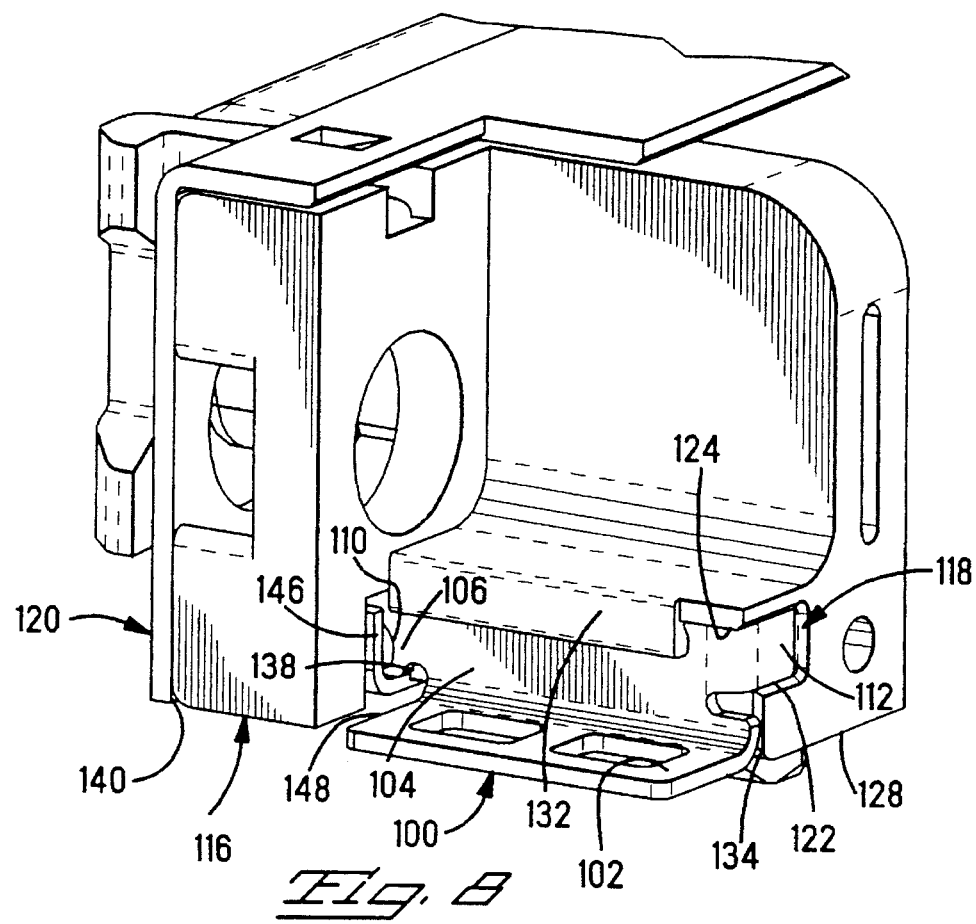
FIG. 8 is an enlarged rear perspective view of the right side of a second embodiment of an electrical connector according to the present invention.
Figure 9:
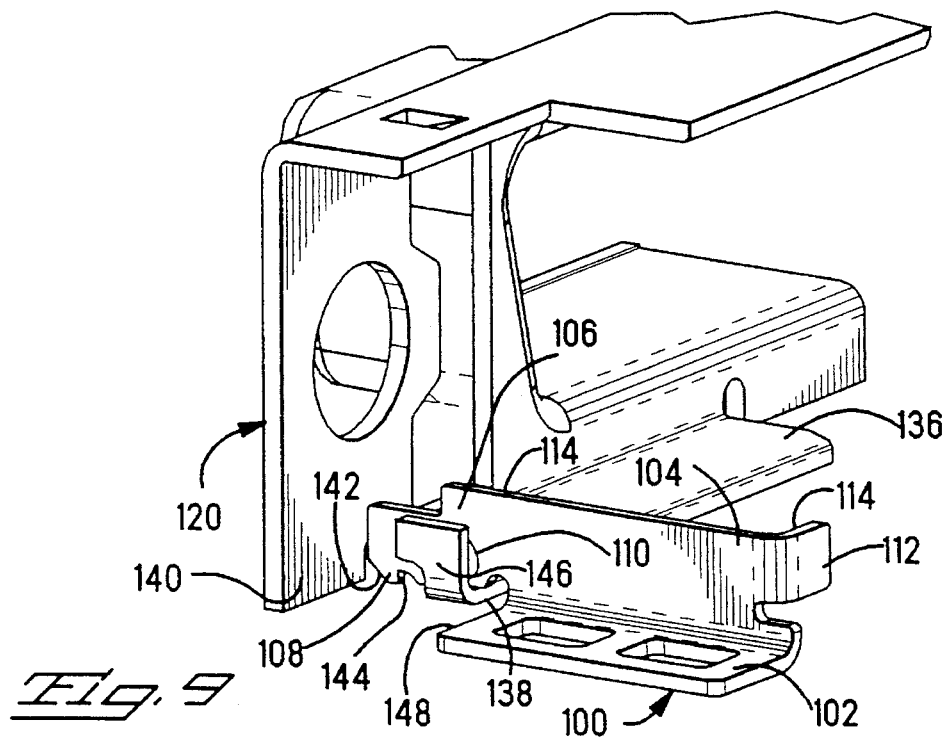
FIG. 9 is a rear perspective view, partially cut away, showing the right side of the metal shell and the right grounding element of the second embodiment of this invention, without the insulating housing.

FIGS. 8, 9 and 10 illustrate a second embodiment of an electrical connector according to this invention. The differences between the second embodiment and the first embodiment relate only to the grounding element and those portions of the insulating housing and the metal shell which cooperate with the grounding element. The remainder of the electrical connector is the same as that of the first embodiment and will not be described again. As shown in the drawings, the modified grounding element 100 has a generally planar solder flange portion 102 and a generally planar connecting portion 104 which is orthogonal to the solder flange portion 102. As with the first embodiment, the grounding element 100 is preferably formed from sheet stock material which is stamped and bent in a conventional manner. The forward end of the connecting portion 104 is formed with a forwardly extending contact region 106. At its extreme forward end, the contact region 106 is formed with a hook 108, whose function will be described in full detail hereinafter. Behind the hook 108, there is a flat lower edge 109, the function of which will be described hereinafter. The contact region 106 is further formed with a projection 110, illustratively substantially hemispherical in shape, rearwardly of the hook 108. The projection 110 extends toward the solder flange portion 102. At its rearward end, the connecting portion 104 is formed with a tab 112 which extends out of the plane of the connecting portion 104 and away from the solder flange portion 102, illustratively at a right angle to the connecting portion 104. The upper edge 114 of the connecting portion 104, including the tab 112, is precisely defined to be parallel to the plane of the solder flange portion 102.

The insulating housing 116 is formed with a cavity 118 for receiving the grounding element 100. As shown in FIG. 8, the cavity 118 is open to the rear and side of the housing 116. Retention of the grounding element 100 within the cavity 118 is performed by cooperation with the metal shell 120, as will be defined hereinafter. The cavity 118 includes a chamber for receiving the tab 112. This chamber has a floor 122 and a roof 124. The roof 124 is precisely defined to be parallel to the lower mounting surface 128 of the housing 116 and extends throughout the cavity 118. The distance between the floor 122 and the roof 124 within the chamber is slightly less than the height of the tab 112 so as to provide an interference fit for the tab 112. The housing 116 is further formed with a downwardly extending wall 132 which forms a channel between itself and the wall 134 forwardly of the aforedescribed chamber. This channel traps therein the upper region of the grounding element connecting portion 104. The cavity 118 is open to the front and bottom of the housing 116 so that the grounding element contact region 106 is exposed.

To cooperate with the grounding element 100, the metal shell 120 has its lower rearwardly extending flange 136 formed with a laterally extending tab 138 which is generally parallel to the solder flange portion 102 of the grounding element 100. This tab 138 is dimensioned to provide a gap between its forward edge and the face plate 140 of the metal shell 120. Thus, when the grounding element 100 is inserted into the cavity 118 of the housing 116, the front edge of the hook 108, which is ramped at 142, passes over the tab 138, thereby deflecting it until the back edge 144 of the hook 108 enters the aforementioned gap, allowing the tab 138 to snap back and interfere with the subsequent removal of the grounding element 100.

The tab 138 includes an end portion 146 which is bent upwardly so as to be generally parallel and adjacent to the contact region 106 of the grounding element 100, with the distance between the bent end portion 146 and the wall 134 of the housing 116 being only very slightly greater than the thickness of the connecting portion 104. This insures that the projection 110 on the contact region 106 frictionally engages the end portion 146 to provide electrical continuity between the grounding element 100 and the metal shell 120. This engagement is supported by the housing through continuation of the wall 134 directly forward of the cavity 118 and adjacent to the projection 110.

As the grounding element 100 is inserted into the cavity 118, due to the interference fit nature of the tab 112 and the chamber floor and roof 122, 124, the back end of the upper edge 114 of the connecting portion 104 on the tab 112 is forced flush against the cavity roof 124 within the chamber. At the same time, the lower edge 109 behind the hook 108 is biased upwardly by engagement with the tab 138 of the shell 120 to force the front end of the upper edge 114 of the connecting portion 104 flush against the roof 124 of the cavity 118. Accordingly, co-planarity of the solder flange portion 102 of the grounding element 100 with the mounting surface 128 of the housing 116 is maintained.

A difference between the first and second embodiments described above is that in the second embodiment, the front edge 148 of the solder flange portion 102 is closer to the edge of the printed circuit card 12 than in the second embodiment. This results from a modification to the insulating housing and provides two advantages. First, there is increased surface area of the solder flange portion 102 for making contact with the ground pad 18 (FIG. 1). Second, since the front edge 148 is closer to the edge of the printed circuit card 12, movement of the connector during mating and unmating with a compatible mating connector results in a smaller moment arm of force on the solder flange portion 102, thereby enhancing the stability and reliability of the connector. Another difference is that in the second embodiment, the grounding elements hook directly into the metal shell. Therefore, a failure mode wherein the housing cracks does not affect the integrity of the ground connection.

Accordingly, there has been disclosed a surface mount electrical connector with an improved grounding element. While illustrative embodiments of the present invention have been disclosed herein, it is understood that various modifications and adaptations to the disclosed embodiments will be apparent to those of ordinary skill in the art and it is intended that this invention be limited only by the scope of the appended claims.

What is claimed is:

1. An electrical connector adapted for surface mounting to a printed circuit card having a plurality of signal traces and at least one ground trace, said connector comprising:

an insulating housing having a forward mating end and a rear end;

a plurality of contacts secured in said insulating housing, said plurality of contacts being exposed at the rear end of said insulating housing for connection to respective ones of said plurality of signal traces on said printed circuit card and being exposed at the forward mating end of said insulating housing for frictional engagement with respective contacts of a mating connector;

a metal shell mounted to and at least partially surrounding said insulating housing for shielding said plurality of contacts; and a grounding element for connection to said metal shell and to said at least one ground trace on said printed circuit card;

said grounding element including a generally planar solder flange portion adapted for a solder connection to said at least one ground trace and a generally planar connecting portion with a forwardly extending contact region adapted for electrical contact with said metal shell;

said insulating housing being formed with a cavity for receiving said grounding element connecting portion with said contact region extending out of said cavity so as to be exposed to said metal shell; and said metal shell being adapted for mounting to said insulating housing from the forward mating end of said insulating housing and being formed with means for engaging said exposed contact region of said grounding element connecting portion.

2. The connector according to claim 1 wherein:

said insulating housing is formed with a latch chamber intersecting said cavity; and said grounding element connecting portion is formed with a resilient latch finger extending rearwardly out of the plane of said grounding element connecting portion, said latch finger being adapted to enter said latch chamber when said grounding element connecting portion is fully inserted in said cavity so as to retain said grounding element connecting portion in said cavity.

3. The connector according to claim 1 wherein:

said grounding element connecting portion is substantially parallel to and offset from said grounding element solder flange portion; and said cavity of said insulating housing is generally planar.

4. The connector according to claim 1 wherein:

said means for engaging said exposed contact region comprises a projection of said metal shell extending toward said exposed contact region of said grounding element connecting portion.

5. The connector according to claims 4 wherein:

said projection of said metal shell is substantially in the form of a hemisphere.

6. The connector according to claim 3 wherein:

said contact region of said grounding element connecting portion is generally rectangular and elongated with a lateral dimension less than the lateral dimension of the remainder of said connecting portion, the remainder of said connecting portion having a shoulder at its forward end adjacent said contact region for interference with a forward wall of said cavity to limit the forward travel of said grounding element during insertion of said grounding element connecting portion into said cavity.

7. The connector according to claim 3 wherein:

said grounding element connecting portion is formed with an opposed pair of laterally extending bulges rearward of said shoulder, the lateral extent of said bulges being slightly greater than the lateral extent of said cavity so as to provide a tight interference fit of said grounding element connecting portion within said cavity.

8. The connector according to claim 7 wherein:

said pair of bulges of said grounding element connecting portion are each shaped as a barb which flares laterally outwardly so as to be narrower toward its forward end, thereby allowing insertion of said grounding element connecting portion into said cavity and interfering with removal of said grounding element connecting portion from said cavity.

9. The connector according to claim 3 wherein:

said insulating housing is formed with a latch chamber intersecting said cavity; and said grounding element connecting portion is formed with a resilient latch finger extending rearwardly out of the plane of said grounding element connecting portion, said latch finger being adapted to enter said latch chamber when said grounding element connecting portion is fully inserted in said cavity so as to retain said grounding element connecting portion in said cavity.

10. The connector according to claim 1 wherein:

said insulating housing is formed with a support ledge external to said cavity and adjacent the forward end of said cavity for supporting said contact region of said grounding element connecting portion in an exposed manner.

11. The connector according to claim 1 wherein:

there is a set of a grounding element, a said cavity and a said means for engaging said exposed contact region at each of the two lateral ends of the connector, with each said set being the mirror image of the other said set.

12. The connector according to claim 1 wherein:

said insulating housing is formed with a resilient latch member having a central open region; and said metal shell is formed with an angled projection adapted to deflect said housing latch member and then enter said latch member open region to allow said latch member to return to its undeflected position when said metal shell is mounted to said insulating housing, said projection and said latch member cooperating to interfere with the subsequent removal of said metal shell from said insulating housing;

whereby deflection of said metal shell is limited so as to insure the integrity of the electrical contact between said metal shell and said grounding element.

13. The connector according to claim 1 wherein said grounding element connecting portion is generally orthogonal to said solder flange portion.

14. The connector according to claim 13 wherein:

said metal shell includes a laterally extending tab generally parallel to said grounding element solder flange portion; and said grounding element contact region is formed with a hook at its forward end adapted to engage said metal shell tab when said grounding element connecting portion is fully inserted in said cavity so as to retain said grounding element connecting portion in said cavity.

15. The connector according to claim 14 wherein:

said metal shell tab includes an end portion which is bent so as to be generally parallel and adjacent to said grounding element contact region; and said grounding element contact region includes a projection extending toward and contacting said tab end portion.

16. The connector according to claim 15 wherein said projection of said grounding element contact region is substantially in the form of a hemisphere.

17. The connector according to claim 14 wherein:

at least a defined upper edge portion of said grounding element connecting portion is remote from and parallel to the plane of said grounding element solder flange portion;

said insulating housing has a generally planar mounting surface for engagement with said printed circuit card; and said insulating housing cavity has a generally planar defined roof portion parallel to the plane of said mounting surface, said defined roof portion being so located that when said grounding element is fully inserted in said cavity said defined upper edge portion engages said defined roof portion;

whereby said solder flange portion of said grounding element is maintained in coplanar relationship with said mounting surface of said insulating housing.

18. The connector according to claim 17 wherein said insulating housing and said metal shell together provide biasing means for engaging said defined upper edge portion against said defined roof portion when said grounding element is fully inserted in said housing cavity.

19. The connector according to claim 18 wherein said biasing means includes:

a tab formed in said grounding element connecting portion at the rear thereof, said tab extending out of the plane of said connecting portion and containing at least a part of said defined upper edge portion; and a defined floor portion of said insulating housing cavity opposite said defined roof portion, said defined floor portion being spaced from said defined roof portion so as to provide an interference fit for said tab so that as said grounding element is inserted into said cavity said connecting portion tab defined upper edge portion is moved into engagement with said cavity defined roof portion.

20. The connector according to claim 18 wherein said biasing means includes:

a flat lower edge on said grounding element contact region rearward of said hook, said lower edge engaging said metal shell tab when said grounding element is fully inserted in said cavity;

whereby said metal shell tab is effective to bias said grounding element upwardly to move said connecting portion defined upper edge portion into engagement with said cavity defined roof portion.

21. An electrical connector comprising: an insulating housing with a bottom for engaging a circuit card, electrical contacts in the housing, a conductive shell on the housing, and a grounding element connected to the shell, a solder flange portion on the grounding element, a contact region on the grounding element frictionally engaging the shell without a separate fastener, a connecting portion on the grounding element connecting the solder flange portion and the contact region, and an interference fit of the connecting portion in a cavity of the housing to maintain the solder flange portion coplanar with the bottom of the housing.

22. An electrical connector as recited in claim 21 wherein, the contact region extends parallel to the solder flange portion and has an interference fit in the cavity.

23. An electrical connector as recited in claim 21 wherein, a hook on the contact region registers in a gap in the shell.

24. An electrical connector as recited in claim 21 wherein, an upper edge of the connecting portion is received along a channel in the housing, and a lower edge of the contact region projects outward of the channel and engages the shell.

25. An electrical connector as recited in claim 21 wherein, a latch on the grounding element engages in a chamber in the housing.

26. An electrical connector as recited in claim 21 wherein, the contact region has an interference fit between a tab on the shell and a wall on the housing.

* * * * *